United States Patent [19]

Bright et al.

[11] Patent Number: 5,448,449

[45] Date of Patent: Sep. 5, 1995

[54] RETAINER FOR SECURING A HEAT SINK TO A SOCKET

[75] Inventors: Edward J. Bright, Middletown, Pa.; James E. Crompton, III, Pfafftown, N.C.; Attalee S. Taylor, Palmyra, Pa.; Kevin E. Walker, Harrisburg, Pa.

[73] Assignee: The Whitaker Corporation, Wilmington, Del.

[21] Appl. No.: 169,791

[22] Filed: Dec. 20, 1993

[51] Int. Cl.⁶ .............................................. H05K 7/20
[52] U.S. Cl. ...................................... 361/704; 24/296; 174/16.3; 248/510; 257/719
[58] Field of Search ............... 267/150, 160; 165/80.3, 165/185; 174/16.3; 24/457, 458, 473, 296, 625, 530, 531, 533; 439/68, 71, 485; 248/316.7, 505, 510; 411/352; 257/706, 707, 713, 718, 719, 727; 361/704, 707, 709, 712, 718, 719, 722

[56] References Cited

U.S. PATENT DOCUMENTS

| | | | |
|---|---|---|---|
| 4,104,700 | 8/1978 | Hutchinson | 361/384 |
| 4,375,309 | 3/1983 | Griffin | 339/75 M |
| 4,504,105 | 3/1985 | Barkus et al. | 339/75 MP |
| 4,553,805 | 11/1985 | Aikens | 339/75 MP |
| 4,571,015 | 2/1986 | Mueller | 339/17 CF |
| 4,621,884 | 11/1986 | Berkebile, Jr. et al. | 339/75 MP |
| 4,623,206 | 11/1986 | Fuller | 339/17 C |
| 4,692,790 | 9/1987 | Oyamada | 357/79 |
| 4,984,997 | 1/1991 | Korsunsky et al. | 439/331 |
| 5,208,731 | 5/1993 | Blomquist | 361/704 |
| 5,241,453 | 8/1993 | Bright et al. | 361/704 |
| 5,256,080 | 10/1993 | Bright | 439/342 |
| 5,271,101 | 12/1993 | Liu | 361/717 |
| 5,323,845 | 6/1994 | Kin-Shon | 165/80.3 |
| 5,329,426 | 7/1994 | Villani | 361/719 |

*Primary Examiner*—Gerald P. Tolin
*Attorney, Agent, or Firm*—Robert J. Kapalka

[57] ABSTRACT

A retainer is disclosed for securing a heat sink having a plurality of parallel vertical fins above an electronic package which is mounted on a socket. The retainer comprises a clip assembly including a clip having a pair of spaced apart beams dimensioned to span the heat sink and to reside in respective grooves between respective pairs of adjacent ones of the fins. The beams are resiliently deflectable in respective planes extending parallel to the fins. One end of the clip is engageable beneath a ledge on one side of the socket. An opposite end of the clip is pivotally coupled to a latch. The latch is engageable beneath a second ledge on an opposite side of the socket upon deflection of the beams in their respective planes. The clip assembly biases the heat sink toward the socket when the one end of the clip and the latch are engaged beneath the first and second ledges. A toggle coupled between the clip and the latch is movable between open and closed positions to engage and disengage the latch with the second ledge. The toggle has an overcenter position corresponding to the closed position such that a force must be applied to the toggle to move the toggle from the closed to the open position.

7 Claims, 5 Drawing Sheets

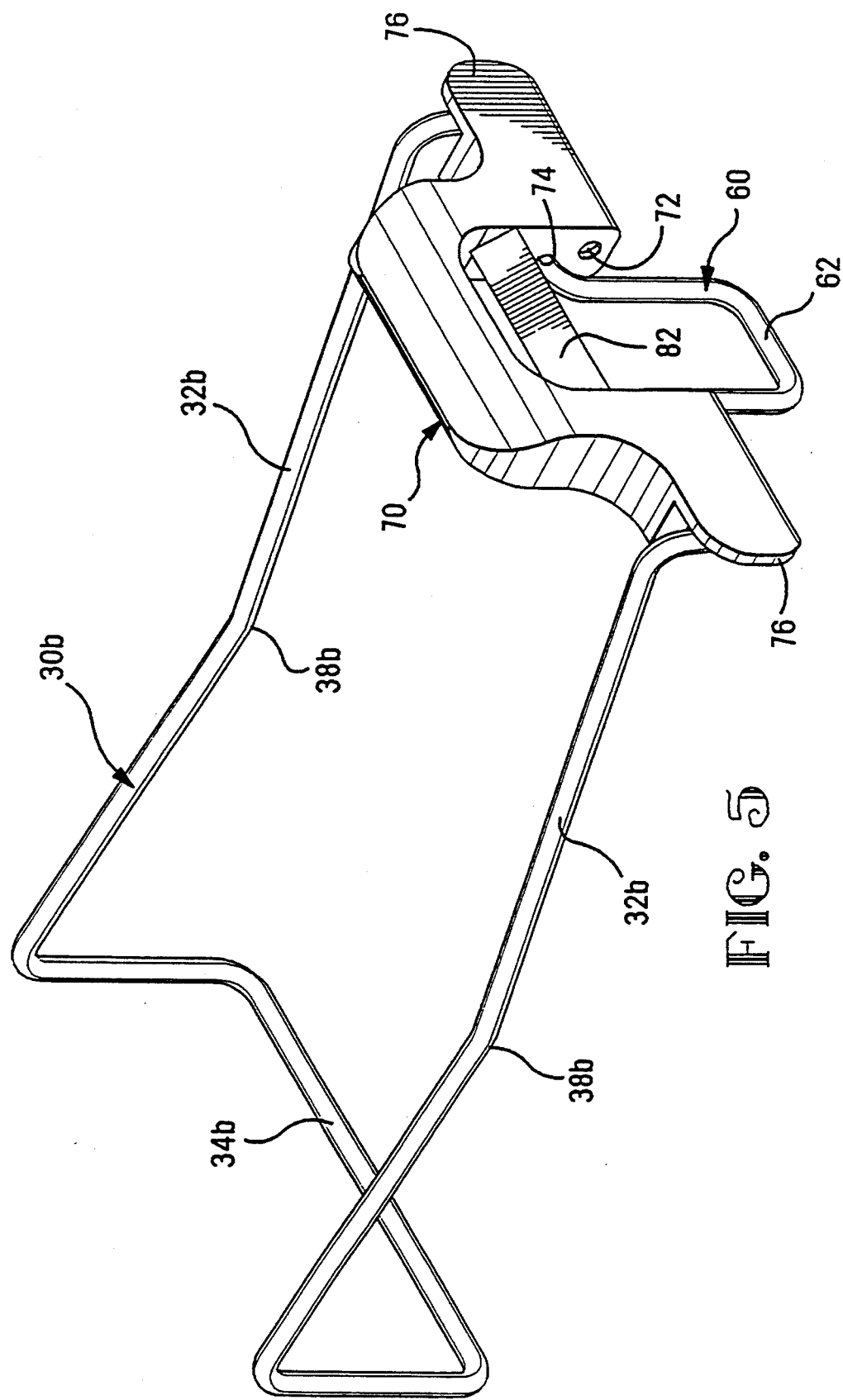

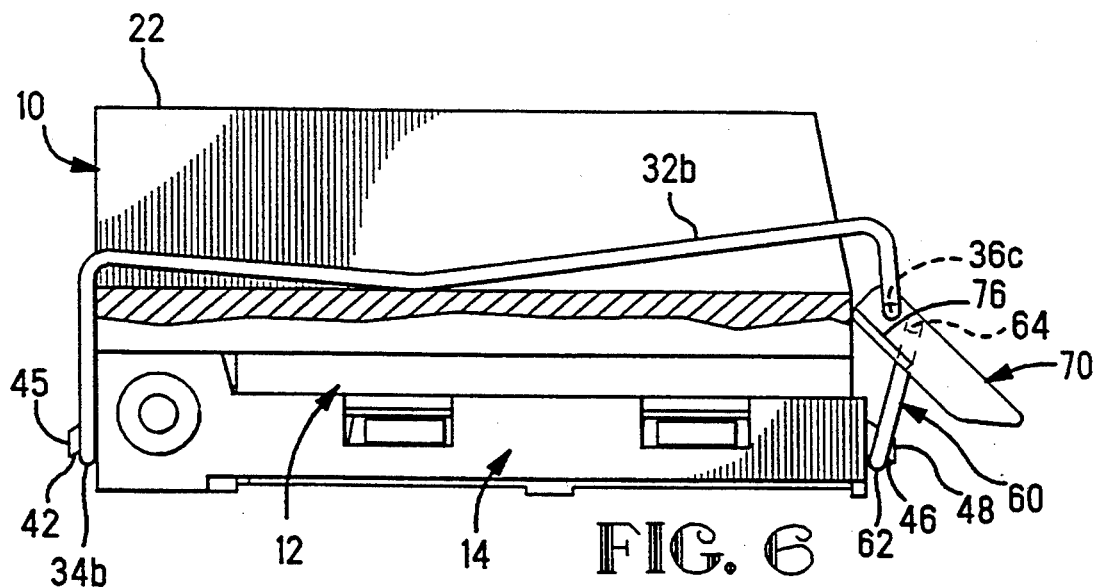
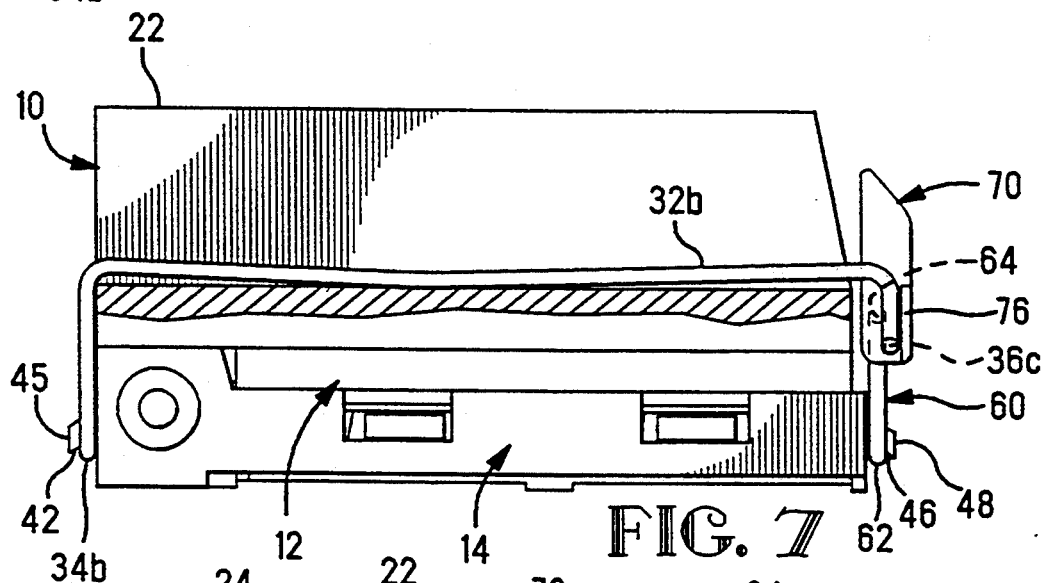
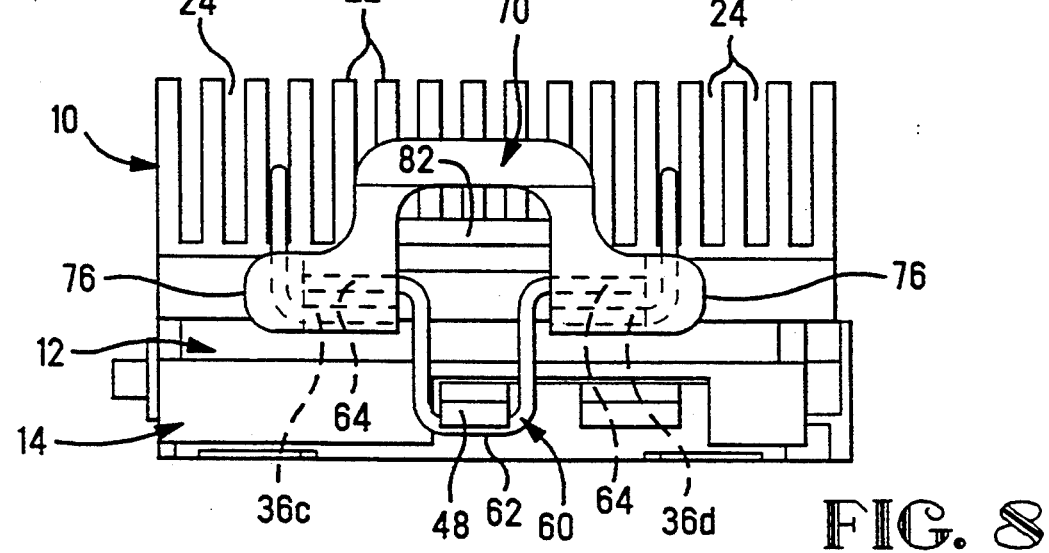

RETAINER FOR SECURING A HEAT SINK TO A SOCKET

FIELD OF THE INVENTION

The invention relates to a retainer in the form of a resilient clip which spans a heat sink and engages with an electrical socket to bias the heat sink toward the socket.

BACKGROUND OF THE INVENTION

An electrical socket such as that disclosed in U.S. Pat. No. 5,256,080 receives an electronic package having electrical leads extending in a pin grid array. The electrical leads are insertable into cavities in a cover of the socket with a zero insertion force. The socket has a cam mechanism which is operable to move the socket cover laterally, whereby the leads of the electronic package are frictionally engaged with terminals of the socket. The frictional engagement of the leads with the terminals secures the electronic package against withdrawal from the socket.

Typically, a heat sink is mounted on the electronic package and is fastened to the package by a clip device. Thus, the frictional force of the terminals acting on the leads must be sufficient to secure both the electronic package and the heat sink against withdrawal from the socket. Heretofore, the available frictional force has been sufficient to retain both the electronic package and the heat sink on the socket.

Technological demands are resulting in the electronic packages becoming ever more complex, thereby consuming greater amounts of power and generating greater amounts of heat. The heat sinks necessary to dissipate this heat are becoming increasingly massive to the point where the frictional force between the leads and the terminals is insufficient to reliably secure the electronic package and its associated heat sink to the socket.

There is a need for an improved device for retaining the heat sink to the socket. The present invention provides a retention device in the form of a resilient clip which spans the heat sink and engages with ledges on the socket to securely fasten the heat sink and electronic package to the socket.

SUMMARY OF THE INVENTION

The invention provides a retainer for securing a heat sink having a plurality of parallel vertical fins in stacked relationship on an electronic package which is mounted on a socket. The retainer comprises a clip having a pair of spaced apart beams dimensioned to span the heat sink and to reside in respective grooves between respective pairs of adjacent ones of the fins. The beams are resiliently deflectable in respective planes extending parallel to the fins. One end of the clip is engageable beneath a ledge on one side of the socket. An opposite end of the clip is pivotally coupled to a latch. The latch is engageable beneath a second ledge on an opposite side of the socket upon deflection of the beams in their respective planes. The clip biases the heat sink toward the socket when the one end of the clip and the latch are engaged beneath the first and second ledges.

The retainer may further include a toggle coupled between the clip and the latch and movable between open and closed positions to engage and disengage the latch with the second ledge. The toggle may be arranged to have an overcenter position corresponding to the closed position such that a force must be applied to the toggle to move the toggle from the closed to the open position.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 5 shows another embodiment of the heat sink retainer.

FIG. 6 is a side view of a socket assembly having the heat sink retainer in an open position.

FIG. 7 is a side view of a socket assembly having the heat sink retainer in a closed position.

FIG. 8 is a front view of a socket assembly having the heat sink retainer in a closed position.

DETAILED DESCRIPTION OF THE PREFERRED EMBODIMENT

Figure 1:
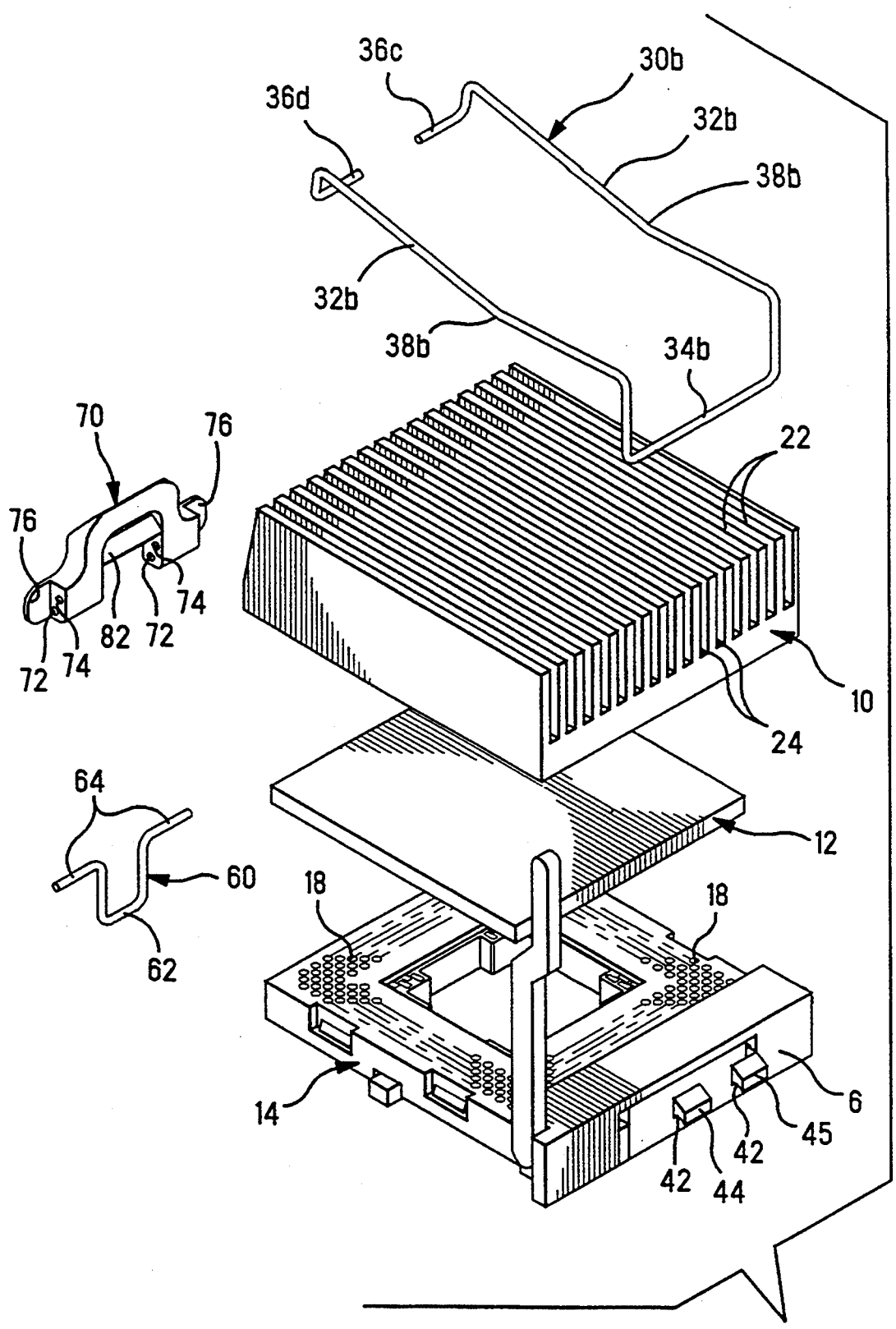
FIG. 1 is an exploded perspective view of a socket assembly having a heat sink retainer according to the invention.
Figure 2:
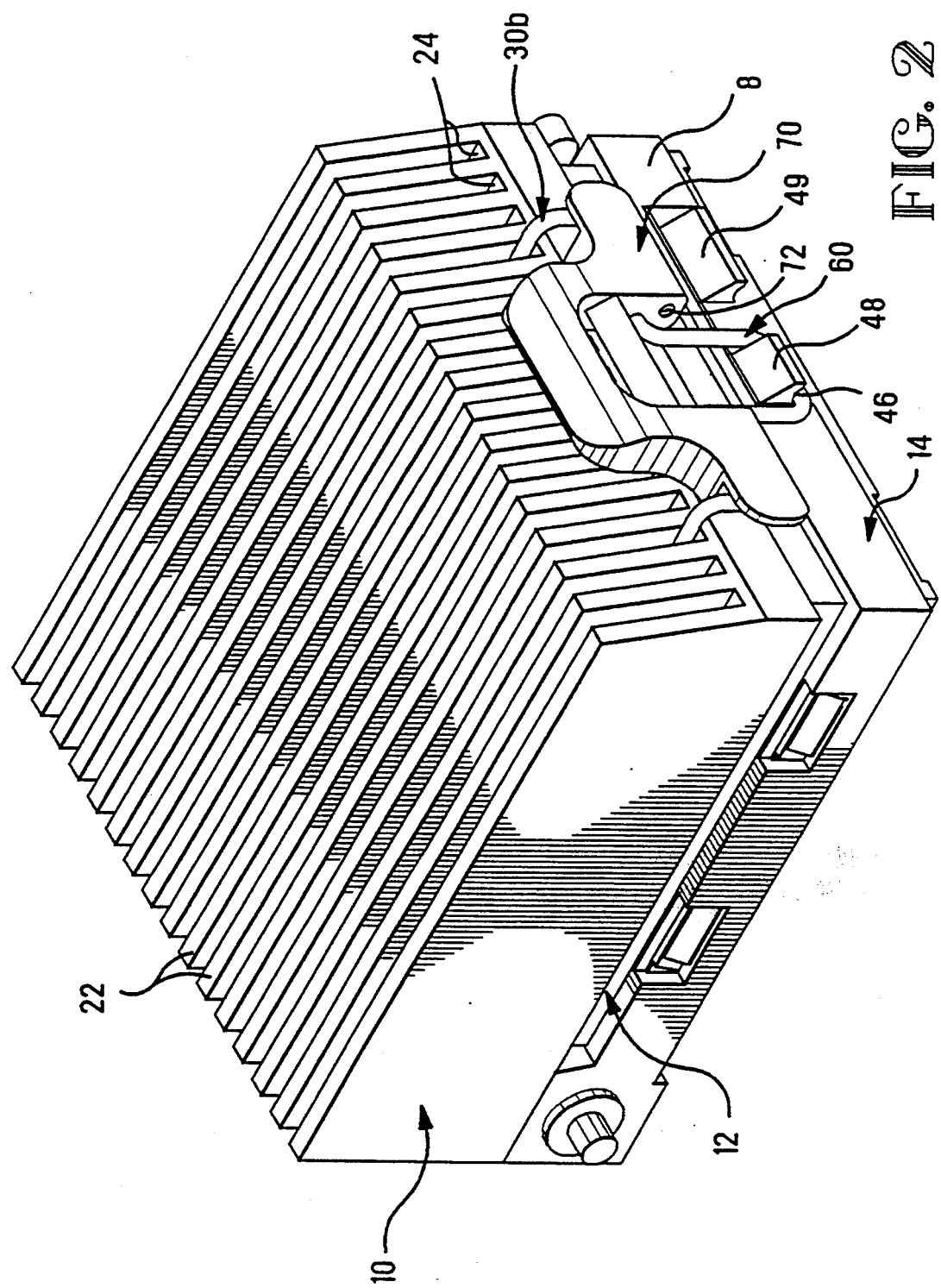
FIG. 2 is a perspective view of the socket assembly and heat sink retainer of FIG. 1 from a reverse angle.

With reference to FIGS. 1 and 2, a retainer according to the invention is useful for securing a heat sink 10 on top of a representative electronic package 12 which is mounted on a socket 14. The socket 14 as illustrated is a pin grid array (PGA) socket which is one well-known type of socket for removably coupling an electronic package to a circuit board or other substrate, but the invention could be adapted for use with other types of sockets such as plastic leaded chip carrier (PLCC) sockets or leadless ceramic chip carrier (LCCC) sockets. The electronic package 12 has a plurality of electrical leads (not shown) which mate with corresponding terminals disposed in cavities 18 of the socket 14. The terminals extend downwardly through a bottom surface of the socket 14 and are electrically connected to circuit paths on a circuit board or other substrate.

The heat sink 10 has a plurality of parallel vertical fins 22 which provide surface area for efficient transfer of heat from the heat sink 10 to ambient air. Grooves 24 are defined between adjacent pairs of the fins 22. The heat sink 10 could also be constructed with cross-grooves which intersect the fins 22 at right angles whereby each of the fins 22 would comprise a row of upstanding rectangular posts or pins.

Figure 3:
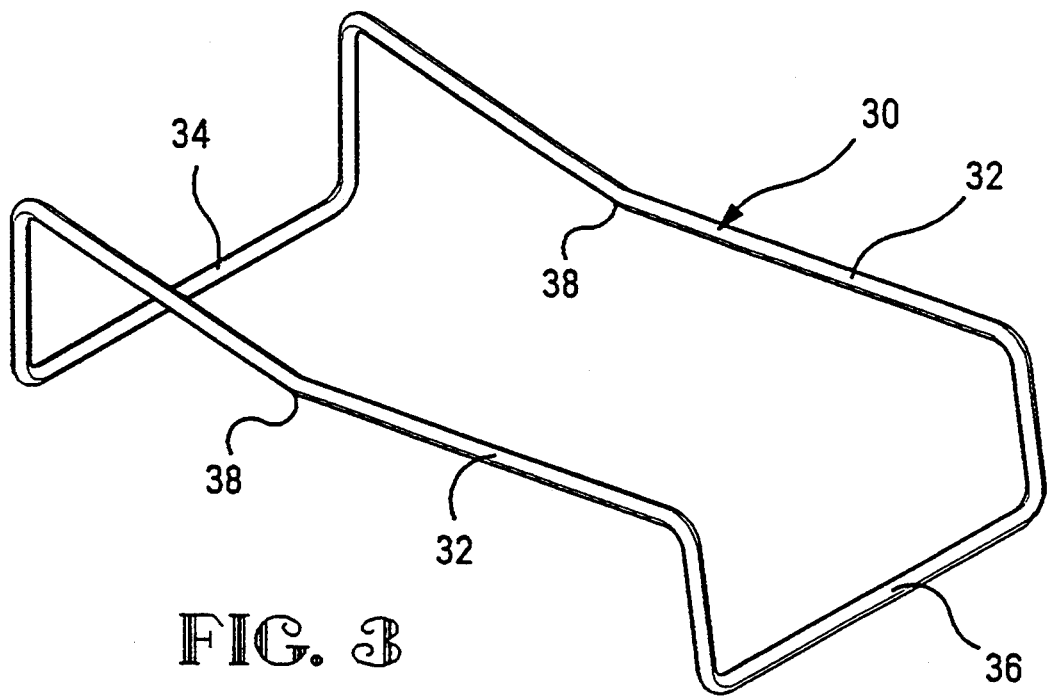
FIG. 3 shows one embodiment of a heat sink retainer according to the invention.

Referring now to FIG. 3, a simple form of the heat sink retainer comprises a unitary clip 30 having a pair of spaced apart main beams 32 which are dimensioned to span across a top of the heat sink 10 and to reside in respective ones of the grooves 24. Opposite ends of the clip 30 extend downwardly and define cross-beams 34 and 36. The cross-beam 34 is engageable beneath a ledge 42 on the socket 14, the ledge 42 in the present example being defined by bottom surfaces of two bosses 44, 45 on one side 6 of the socket 14. The cross-beam 36 of the clip 30 is engageable beneath a second ledge 46 which in the present example is defined by a bottom surface of boss 48 on an opposite side 8 of the socket 14.

It is preferred that the socket 14 have a second boss 49 on the side 8 similar to the boss 45 on the side 6, whereby the retainer according to the invention could be applied to the socket 14 in either of two directions which are spaced 180° apart.

The main beams 32 are resiliently deflectable in respective planes extending parallel to the fins 22. In order to provide good deflection characteristics, each of the main beams 32 is formed with a slight bow or concavity which is upwardly open in its respective plane. The concavity may be provided by a bend 38 of the main beam 32 at an intermediate position along its length.

The clip 30 is applied to the heat sink 10 when the electronic package 12 and heat sink 10 are disposed on the socket 14. With one of the cross-beams of the clip 30 engaged beneath its respective ledge, for example with the cross-beam 34 engaged beneath the ledge 42, a downward force is applied to the clip 30 such as by finger pressure or by a tool applied to the cross-beam 36. The downward force will cause a straightening of the bow or concavity of the main beams 32 as the beams 32 are urged against a top of the heat sink. Continued application of force will cause the cross-beam 36 to contact the boss 48 and to be deflected outwardly beyond an end of the boss 48 until the cross-beam 36 is able to pass beneath the boss 48, whereupon the cross-beam 36 will spring back and become engaged beneath the ledge 46. When the main beams 34, 36 are engaged beneath their respective ledges 42, 46, deflection of the main beams 32 biases the heat sink 10 toward the socket 14.

The clip 30 can be removed by prying one of the cross-beams 34, 36 outwardly with a screwdriver or other tool to disengage that cross-beam from beneath its respective ledge 42, 46, whereupon spring action of the main beams 32 will return a bow shape to the main beams.

The clip 30 could also be constructed with just one of the main beams 32 extending between the cross-beams 34, 36 in a substantially "I" formation.

Figure 4:
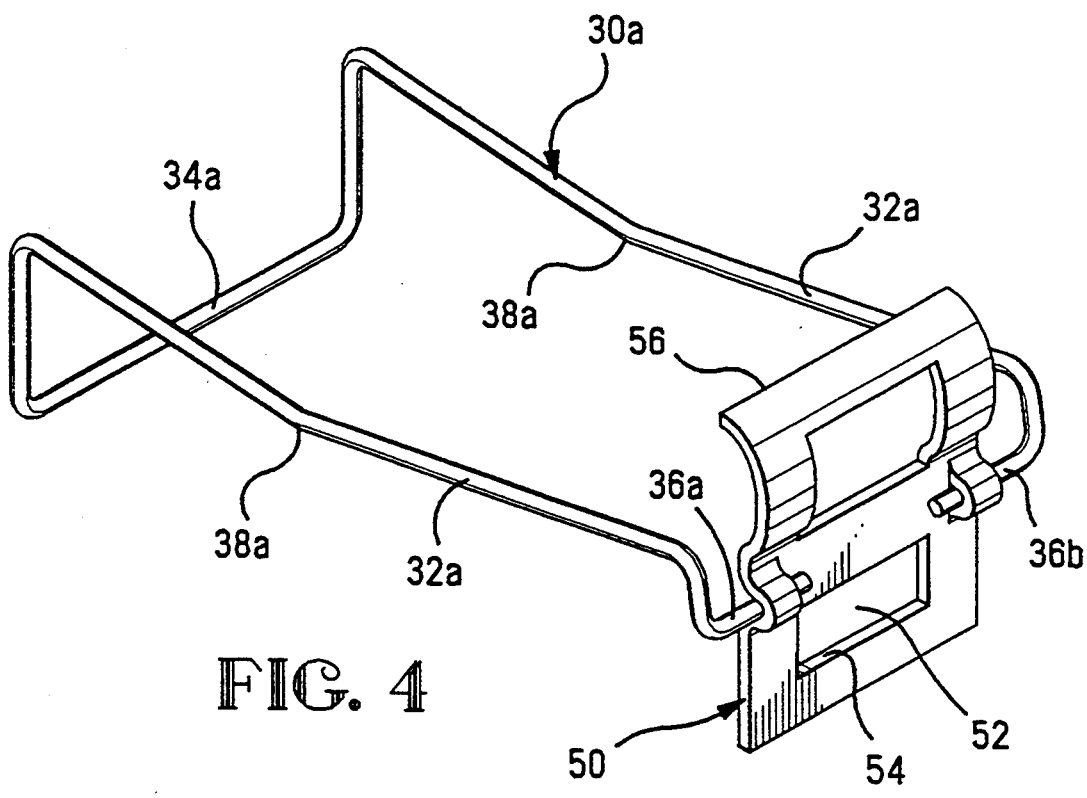
FIG. 4 shows another embodiment of the heat sink retainer.

Other embodiments of the invention will be discussed with reference to the drawings wherein elements like those of the previous embodiment are referred to by like reference numbers having a letter suffix. In the embodiment shown in FIG. 4, the retainer comprises a clip assembly including a clip 30a and a latch 50 which is pivotally coupled to cross-beam portions 36a, 36b of the clip 30a. The latch 50 includes an aperture 52 which can receive the boss 48 of the socket 14 to permit surface 54 of the latch to engage the ledge 46. The latch 50 further includes a handle portion 56 which can be gripped by hand or engaged by a tool to pivot the latch 50 in one direction or the other. A torsion spring may be provided to bias the latch 50 in one direction for positive engagement with the latch 48. The main beams 32a are bowed and resiliently deflectable so that the clip 30a functions to bias the heat sink 10 toward the socket 14 in the manner previously described when the clip 30a is attached above the heat sink on the socket 14.

Another embodiment of the retainer is shown alone in FIG. 5 and as part of a socket assembly in FIGS. 1 and 2. The retainer comprises a clip assembly including a clip 30b, a latch 60 and a toggle 70. The latch 60 is a wireform having a latch bar 62 engageable with the ledge 46 of the boss 48. Arms 64 of the latch 60 are pivotally received in recesses 74 defined by the toggle 70, thereby defining a pivotal coupling of the toggle 70 with the latch 60. Cross-beam portions 36c, 36d of the clip 30b are pivotally received in recesses 72 defined by the toggle 70, thereby defining a pivotal coupling of the toggle 70 with the clip 30b.

The latch 60 and the toggle 70 are movable between an open position shown in FIG. 6 and a closed position shown in FIG. 7. When the latch bar 62 is engaged beneath the ledge 46 as shown in FIG. 6, moving the toggle 70 to the closed position pivots the latch 60 on an axis defined by the latch bar 62, draws the cross-beam portions 36c, 36d of the clip downwardly, and deflects the main beams 32b so as to reduce their bow, thereby biasing the heat sink 10 toward the socket 14. The toggle has ears 76 which abut end portions of the clip 30b when the toggle and latch mechanism are fully closed.

The toggle 70 is arranged to have an overcenter position corresponding to its closed position. In the overcenter position, a force must be applied to the toggle 70 to move the toggle to the open position. The overcenter arrangement of the toggle and latch mechanism prevents inadvertent release of the latch bar 62 from beneath the ledge 46 when the toggle 70 is fully closed. As the toggle 70 is moved from the open position to the closed position it passes through a center position wherein the latch bar 62, the latch arms 64 and the cross-beam portions 36c, 36d are aligned in a plane. When the toggle 70 is in the center position the main beams 32b are in maximum deflection, i.e., minimum bow. Movement of the toggle 70 beyond the center position to the closed position shown in FIG. 7 results in a slight rise of the cross-beam portions 36c, 36d with respect to the socket 14, thereby permitting a slight increase in the bow of the main beams 32b. In order to move the toggle 70 back through the center position, the main beams 32b must again be deflected to the maximum amount against the resistance provided by their normal bow shape. This requires that a force be applied to the toggle 70 to draw the cross-beam portions 36c, 36d slightly downward which slightly increases the deflection of the main beams 32b. When this force is applied and the toggle 70 is moved from the closed position back through the center position, stored energy in the main beams 32b will urge the toggle fully open with a snap action.

The retainer according to the invention may be used on a socket which is in a densely packed enclosure, thereby making hand access to the toggle 70 difficult. The toggle 70 may have a pry bar 82 which is engageable by a screwdriver or other tool to enable easier application of forces to open or close the toggle 70.

In the illustrated embodiments the retainer is completely removable from the socket 14. This provides best access for removing or inserting the electronic package 12 and heat sink 10 from or on the socket. Alternatively, the retainer could be coupled to the socket, for example, the one end 34, 34a, 34b of the clip could be pivotally coupled to the side 6 of the socket 14 by rotatably supporting the one end 34, 34a, 34b in through bores defined by the bosses 44.

A retainer according to the invention has a number of advantages. The retainer has an audible click and a tactile feel when latched. The retainer transmits minimal forces to the circuit board on which the socket is disposed. An overcenter latch closure may be provided. The retainer latch mechanism is hand operable or it may be pried with a screwdriver, but no special tools are required for operation. The simple retainer design prevents overstress which could damage latch mechanism or the spring characteristics of the retainer.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A retainer and heat sink assembly securable above an electronic package which is mounted on a socket, comprising:

a heat sink having a plurality of parallel vertical fins; and a clip assembly including a clip having a pair of spaced apart beams spanning said heat sink and residing in respective grooves between respective pairs of adjacent ones of said fins, said beams being resiliently deflectable in respective planes extending parallel to said fins, said beams being connected by a crossbeam which is engageable beneath a first ledge on one side of said socket, a latch pivotally coupled to said clip, said latch being engageable beneath a second ledge on an opposite side of said socket upon deflection of said beams in said planes, and a toggle pivotally coupled between said clip and said latch and movable between open and closed positions to engage and disengage said latch beneath said second ledge, wherein said clip assembly biases said heat sink toward said socket when said crossbeam and said latch are engaged beneath said first and second ledges.

2. The retainer according to claim 1, wherein said toggle is arranged to have an overcenter position corresponding to said closed position such that a force must be applied to said toggle to move said toggle from said closed to said open position.

3. The retainer according to claim 2, wherein said clip and said latch each comprise formed wire members.

4. A socket assembly, comprising:

a socket body having a plurality of terminals for electrically connecting an electronic package to a substrate;

an electronic package mounted on the socket body;

a heat sink disposed in thermal communication with the electronic package, the heat sink having a plurality of parallel vertical fins; and, a clip assembly securing the heat sink to the socket body, the clip assembly including a clip having a pair of spaced apart beams which span the heat sink and reside in respective grooves between respective pairs of adjacent ones of said fins, one end of said clip being coupled to one side of said socket body, an opposite end of said clip being pivotally coupled to a latch, said latch being engaged beneath a ledge on an opposite side of said socket, said beams being resiliently deflected in respective planes extending parallel to said fins, wherein said clip assembly biases said heat sink toward said socket.

5. The retainer according to claim 4, wherein said clip assembly further includes a toggle pivotally coupled between said clip and said latch and movable between open and closed positions to engage and disengage said latch beneath said ledge.

6. The retainer according to claim 5, wherein said toggle is arranged to have an overcenter position corresponding to said closed position such that a force must be applied to said toggle to move said toggle from said closed position to said open position.

7. The retainer according to claim 6, wherein said clip and said latch are each formed from unitary wire members.

* * * * *